United States Patent [19]
Hongo

[11] Patent Number: 6,127,207
[45] Date of Patent: Oct. 3, 2000

[54] SEMICONDUCTOR INTEGRATED CIRCUIT AND FABRICATION METHOD THEREFOR

[75] Inventor: Katsunobu Hongo, Tokyo, Japan

[73] Assignee: Mitsubishi Denki Kabushiki Kaisha, Tokyo, Japan

[21] Appl. No.: 09/225,504

[22] Filed: Jan. 6, 1999

Related U.S. Application Data

[62] Division of application No. 08/759,882, Dec. 3, 1996, Pat. No. 5,889,334.

[30] Foreign Application Priority Data

Jun. 26, 1996  [JP]  Japan ................................ 8-166134

[51] Int. Cl.$^7$ ........................... H01L 21/44; H01L 21/48; H01L 21/50
[52] U.S. Cl. ........................... 438/123; 438/106; 438/121; 438/612
[58] Field of Search ................................ 438/123, 106, 438/121, 612

[56] References Cited

U.S. PATENT DOCUMENTS

| | | |
|---|---|---|
| 5,455,460 | 10/1995 | Hongo et al. . |
| 5,512,765 | 4/1996 | Gaverick ................................ 438/107 |
| 5,650,357 | 7/1997 | Dobkin et al. ........................... 438/107 |
| 5,744,379 | 4/1998 | Mandai et al. ........................... 438/107 |
| 5,780,772 | 7/1998 | Singh et al. ............................ 438/123 |

FOREIGN PATENT DOCUMENTS

| | | |
|---|---|---|
| 59-145542 | 8/1984 | Japan . |
| 5-36947 | 2/1993 | Japan . |
| 5-243492 | 9/1993 | Japan . |
| 5-343620 | 12/1993 | Japan . |

*Primary Examiner*—Kevin M. Picardat
*Assistant Examiner*—D. M. Collins
*Attorney, Agent, or Firm*—Burns, Doane, Swecker & Mathis, LLP

[57] ABSTRACT

A semiconductor integrated circuit and a fabrication method therefor has the configuration that the number of pad driver cells 21 to 23 are equal to or more than the number of input/output control circuits 11 to 13, poly-silicon wirings 111 to 113 are connected to an input terminal IN and output terminals CP and CN in each of the input/output control circuit 11 to 13 in a wiring region LIN and poly-silicon wirings 211 to 233 are connected to input terminals CP and CN and an output terminal-IN of each of the pad driver cells 21 to 23 in the wiring region, and the poly-silicon wirings 111 to 133 are connected to poly-silicon wirings 211 to 233 through aluminum wirings.

3 Claims, 9 Drawing Sheets

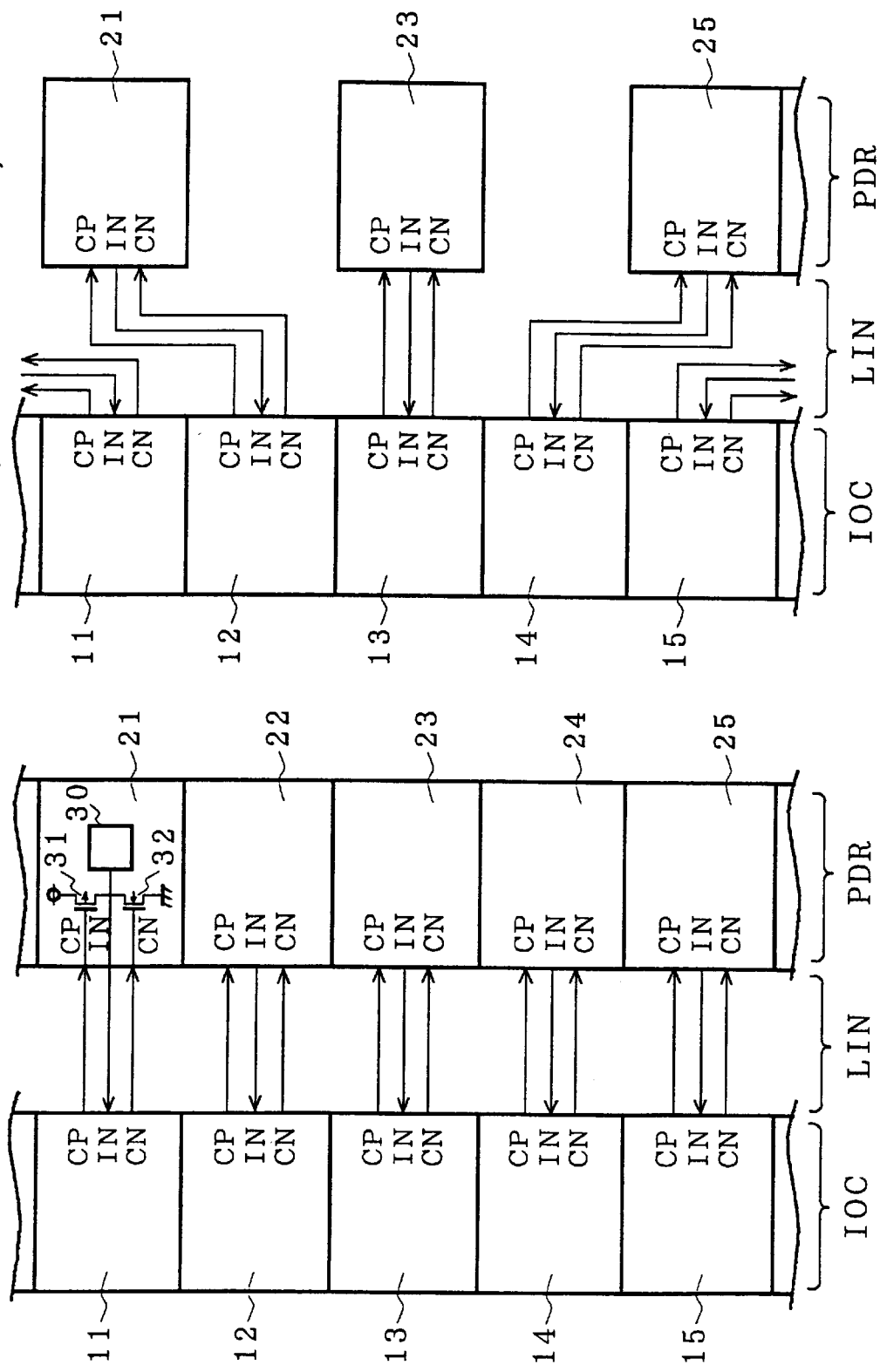

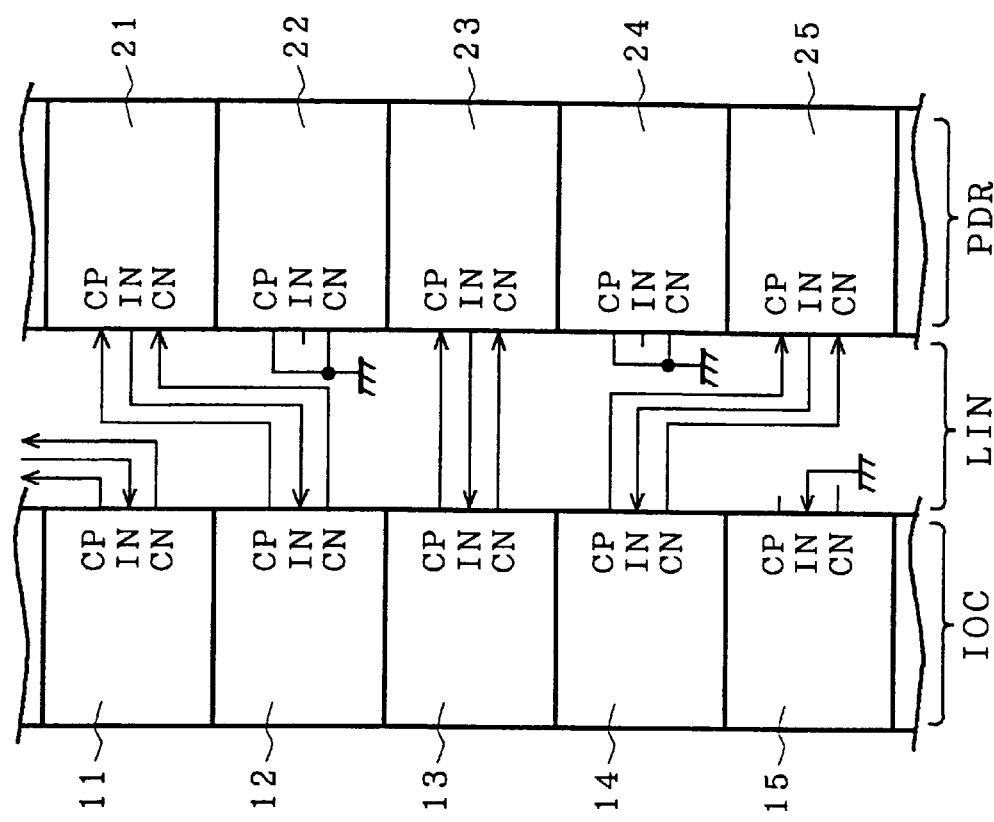
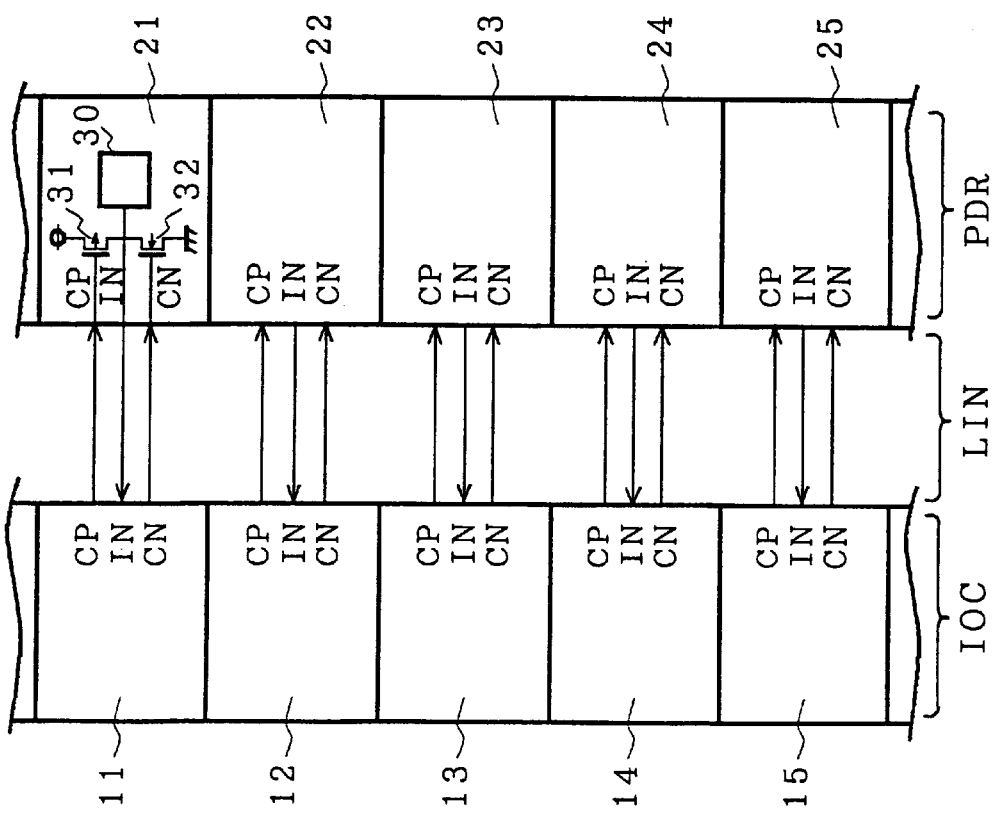

SEMICONDUCTOR INTEGRATED CIRCUIT AND FABRICATION METHOD THEREFOR

This application is a divisional, of application Ser. No. 08/759,882, filed Dec. 3, 1996 U.S. Pat. No. 5,889,334.

BACKGROUND OF THE INVENTION

1. Field of the Invention

The present invention relates to a semiconductor integrated circuit such as microcomputers having input/output ports through which data are transferred between the semiconductor integrated circuit of the present invention and other circuits mounted on other semiconductor chips and a fabrication method of the semiconductor integrated circuit.

2. Description of Related Art

FIGS. 1A and 1B are diagrams each showing a layout of semiconductor elements (only one is shown in each of the diagrams for brevity) and leads connected to lead frames in a conventional semiconductor integrated circuit having conventional input/output ports (hereinafter, referred to only as "ports"). In FIGS. 1A and 1B, the reference number 1 designates a semiconductor element (hereinafter, referred to as "a semiconductor chip"), 21 to 25 denote pad driver cells, each pad driver cell includes a pad and an output driver, the reference character IOC indicates an input/output control circuit region in which input/output control circuits are formed in the semiconductor chip 1, LIN denotes wiring region in which wirings are formed between the input/output control circuits and the pad driver cells 21 to 25, and PDR designates cell regions in which the PAD driver cells are formed. In FIGS. 1A and 1B, there are pad driver cells which are designated by no reference numbers for brevity.

The reference numbers 61 to 65 designate leads made from gold wires or aluminum wires connecting the pad driver cells 21 to 25 with corresponding lead frames. In FIGS. 1A and 1B, there are leads designated by no reference numbers. The reference number 200 designates a region in which no pad driver cell is formed.

In general, each semiconductor integrated circuit such as a micro-computer and the like is sealed with a plastic package or a ceramic package in order to protect the semiconductor integrated circuit from damages.

There are many kinds of packages which are different from each other in shape and in terminal number (or in pin number). Requirement in application and cost selects a package shape and the number of terminals.

However, because it takes much time and a lot of cost to develop semiconductor integrated circuits, it is difficult to prepare packages in which the number of terminals in each package is correspond to a semiconductor integrated circuit and it is also difficult to provide semiconductor integrated circuits whose shapes are different. Specifically, there are many user's requirements in order to obtain semiconductor integrated circuits having many port terminals and to use semiconductor integrated circuits in which the number of terminals is decreased in order to reduce implementing area.

FIGS. 1A and 1B show semiconductor chips 1-1 and 1-2 and leads 61 and 65 in two types of semiconductor circuits whose shapes and areas are same to each other but whose terminal numbers are different. Specifically, FIG. 1A shows the semiconductor integrated circuit having 24 pins and FIG. 1B shows the semiconductor integrated circuit having 20 pins.

FIG. 2 is a circuit diagram showing a circuit configuration of each of pad driver cells 21 to 25. In FIG. 2, the reference number 31 designates a P-channel MOS transistor whose source is connected to a power source and whose drain is connected to both a pad 30 and an input wire IN of an input/output control circuit. The reference number 32 denotes a N-channel MOS transistor whose drain is connected to the drain of the P-channel MOS transistor and whose drain is connected to the ground.

The gates of the P-channel and N-channel MOS transistors 31 and 32 are connected to output control wires CP and CN of the input/output control circuit, respectively. These P-channel and-N-channel MOS transistors form an output driver.

In addition, as shown by the dotted lines in FIG. 2, there is a case that the level of the input wire of the input/output control circuit is pulled up by the P-channel MOS transistor 33 whose operation is controlled by the level of a control signal transferred through a pull up control wire UC. In this case, the P-channel MOS transistor 31, the N-channel MOS transistor 32, and the P-channel MOS transistor 33 make up the input/output driver.

FIG. 3 is a block diagram showing an example of a configuration of the input/output control circuit. In the diagram, the reference number 41 designates a direction register for indicating a direction of a port, 42 denotes a port latch for latching output data transferred from a microcomputer through data buses, and 43 indicates a gate circuit which is open only when the port enters an input mode. The reference number 44 designates a pull-up control circuit for transferring a low level control signal through the pull up control wire UC only when the direction register 44 enters the input mode, 45 denotes an inverting AND circuit for outputting the inverted value of a value stored in the port latch 42 only when a value stored in the direction register 41 is "1", 46 indicates an inverting OR circuit for providing a value stored in the port latch 42 only when the value stored in the direction register is "1", and 47 indicates an inverter located between the direction register 41 and the inverting OR circuit 46. By the way, there is a case that no pull up circuit 44 is incorporated in the input/output control circuit designated by the dotted lines in FIG. 3.

A central processing unit (CPU) in the microcomputer sets "1" into the direction register 41 when the input/output control circuit enters an output mode, and sets "0" when an input mode.

When the value stored in the direction register 41 is "1", a level corresponding to data latched in the port latch 42 is transferred to the output control wires CP and CN. Then, the level corresponding to the data latched in the port latch 42 is transferred to a lead (a pin) in the semiconductor integrated circuit through the pad 30 and the lead frame.

On the other hand, when the value stored in the direction register 41 is "0", a level to set an off state to the P-channel and N-channel MOS transistors 31 and 32 is transferred to the output control wires CP and CN and the gate circuit 43 enters a signal passing state in which the signal is passing through the gate circuit 43. Thereby, the level of the signal received through a lead in the semiconductor integrated circuit is transferred to data buses. A port function in the semiconductor integrated circuit is achieved by using this input/output control circuit.

Next, a wiring method in the conventional semiconductor integrated circuit will now be explained.

Twenty four pad driver cells including the pad driver cells designated 21 to 25 are formed in the semiconductor chips 1-1 and 1-2, as shown in FIGS. 1A and 1B.

The all of the pad driver cells are wired to connect the pad driver cells with the corresponding lead frames in a 24 pin package such as the semiconductor chip 1-1. However, in a 20 pin package such as the semiconductor chip 1-2, there are the pad driver cells which are connected to no lead frame. These pad driver cells are allocated separately in the semiconductor chip, for example, allocated at every position of fourth pad driver cell.

Here, we assume that the pad driver cells 21 to 25 are corresponding to the ports A0 to A4, respectively, in order. In the example shown in FIG. 1B, the pad driver cell 22 has no wiring. In this case, there is no port A1 in the 20 pin package. That is, there are only ports A0, A2, A3 and A4 as the terminals of the semiconductor integrated circuit. We consider the shape of the semiconductor integrated circuit including the entire pad driver cells including them other than the pad driver cells 21 to 25. For example, in the 24 pin package, the ports A0 to A7, B0 to B7 are connected to the terminals of the semiconductor integrated circuit continuously. On the other hand, in the 20 pin package, only the ports A0 to A2, A4 to A6, B0 to B2, and B4 to B6 are connected to the terminals of the semiconductor integrated circuit.

We will now explain the above configuration in detail. The first case, namely the ports are connected to the terminals continuously, means that the terminals corresponding to the ports A0 to A7 are allocated to the first to eighth terminals which are placed continuously. When using the shape of the semiconductor integrated circuit 1-1 as the semiconductor integrated circuit 1-2, there is a disadvantage for 20 pin package users that ports can not be allocated per 4 bit unit or per 8 bit unit which is a basic unit for data processing in microcomputers. For example, in a case that the semiconductor integrated circuit is a microcomputer, programmers as users must develop programs while taking into serious consideration to ports allocated separately that can not be used.

In order to avoid the disadvantage in the conventional semiconductor integrated circuit described above, for example, it can be considered that the pad driver cells corresponding to the port B4 to B7 have no wirings so that the port A0 to A7 and B0 to B3 are connected to the terminals continuously. However, in this case, the positions of the pad driver cells having the wirings become offset. Because, each lead frame is allocated without offset, in general, this causes that there is a pad driver cell connected to a lead frame with a long wiring. However, when the length of a wiring becomes long, a lead is easier to connect electrically with a semiconductor substrate and the semiconductor chip 1-1, so that there is a limit, namely, it is difficult to connect a pad driver cell to a lead frame with a long wiring.

Accordingly, in a 20 pin package, pad driver cells that have no wirings must be allocated separately. In general, the recommended range of a length of a lead is determined every semiconductor integrated circuit fabrication companies.

FIGS. 4A and 4B are diagrams showing a layout of the input/output control circuits 11 to 15, the wiring region LIN, and the pad driver cells 21 to 25 when both a package having a large number of pins and a package having a small number of pins are formed by changing a semiconductor chip layout.

FIG. 4A shows a layout of a semiconductor chip having the large number of pins and FIG. 4B shows a layout of a semiconductor chip having the small number of pins.

When both semiconductor chips are compared in pin arrangement, the pad driver cells 21 to 25 are arranged closely in the semiconductor chip having the larger number of pins. On the other hand, the pad driver cells 21 to 25 are arranged roughly in the semiconductor chip having the small number of pins.

In the case that the input/output control circuits 11 to 15 shown in FIGS. 4A and 4B are corresponding to the ports A0 to A4, the input/output control circuits 11 and 15 are connected to pad driver cells corresponding to the port A0 and A4 (not shown) in the semiconductor chip having the small number of pins shown in FIG. 4B. The input/output control circuits 12, 13 and 14 are connected to the pad driver cells 21, 23 and 25, respectively. The pad driver cells (not shown) are connected to terminals corresponding to the ports A0 and A4 through the lead frames. The pad driver cells 21, 23 and 25 are connected to the terminals corresponding to the ports A1, A2 and A3, respectively.

By using the manner described above, the ports A0 to A4 are connected to terminals continuously in the semiconductor integrated circuit having the small number of pins. It can therefore be avoided that it is difficult to allocate ports every a four bit unit or every an eight bit unit.

However, it must be required to form a semiconductor fabrication mask used in each process in semiconductor chip fabrication processes which is different from a mask used in each process in them for the semiconductor chip having the large number of pins shown in FIG. 4A. In addition, there are many costs for fabricating the masks. Thus, it takes many times and much costs for fabricating semiconductor integrated circuits having chips corresponding to many types and shapes of packages.

The literature of the Laid open publication number: JP-A-59/145542 discloses a technique in which a plurality of input/output circuit sections and a plurality of pads are formed in a peripheral section in a semiconductor chip in order to apply many types of packages by changing wirings between each input/output circuit section and the each pad according to the terminal number of terminals in each package. However, this literature of JP-A-59/145542 described above does not disclose any actual manner for wirings between input/output circuit sections and pads.

Because the conventional semiconductor integrated circuit has the configuration described above, there is a drawback that it is difficult to allocate terminals corresponding to ports continuously when a semiconductor chip is sealed in other types of packages.

In addition, in the semiconductor integrated circuit, there is another drawback that each mask used for each of semiconductor fabrication processes for forming a semiconductor chip having a small number of pins must be changed when terminals corresponding to ports are arranged continuously.

SUMMARY OF THE INVENTION

Accordingly, an object of the present invention is, with due consideration to the drawbacks of the conventional semiconductor integrated circuit, to provide a semiconductor integrated circuit and a fabrication method therefor, which are capable of applying any type of packages easily, only by changing a part in semiconductor integrated circuit fabrication processes.

In accordance with one aspect of the present invention, a semiconductor integrated circuit comprises a plurality of input/output control circuits, a plurality of pad driver cells, each pad driver cell being connectable to each lead frame, and a wiring region formed between the plurality of input/output control circuits and the plurality of pad driver cells, wherein the number of the plurality of pad driver cells is the same or more as the number of the plurality of input/output control circuits, third wirings made up of a material or materials which connect a first wirings connected to the plurality of input/output control circuit to a second wirings connected to the plurality of pad driver cells and the material of the third wirings are different from a material or materials forming the first wirings and the second wirings, there are no wirings between specified input/output control circuit which being located continuously in position in the plurality of input/output control circuits and the plurality of pad driver cells, and there are no wirings between specified pad driver cells, which are selectively or discretely located, in the plurality of pad driver cells and the plurality of input/output control circuits.

In the semiconductor integrated circuit as another preferred embodiment according to the present invention, wirings connected to the input terminals in the wirings connected to the specified input/output control circuits continuously positioned and connected to the specified pad driver cells continuously located are connected to a power source or to a ground and the wirings connected to the output terminals are open.

In the semiconductor integrated circuit as another preferred embodiment according to the present invention, each of the plurality of pad driver cells has a driver whose driving ability is equal to or more than the maximum driving ability in a driving ability required for each port which is connected to each of the corresponding input/output control circuit through the wiring region.

In the semiconductor integrated circuit as another preferred embodiment according to the present invention, the pad driver cell has a function corresponding to a function of the port corresponding to the input/output control circuit connected to this pad driver cell through the wiring region.

In the semiconductor integrated circuit as another preferred embodiment according to the present invention, the total number of the plurality of pad driver cells is greater than that of the plurality of input/output control circuits.

In accordance with another aspect of the present invention, a fabrication method of a semiconductor integrated circuit comprising a plurality of input/output control circuits, a plurality of pad driver cells, each pad driver cell being connectable to each lead frame, and a wiring region formed between the plurality of input/output control circuits and the plurality of pad driver cells, the fabrication method comprises a step of forming the plurality of pad driver cells whose number is equal to or more than the number of the plurality of input/output control circuits, a step of forming wirings connected to input and output terminals in each of the plurality of input/output control circuits and wirings connected to input and output terminals in each of the plurality of pad driver cells in the wiring region, each length of the wirings having an inherent length, respectively, a step of connecting in the wiring region between the wirings connected to the plurality of input/output control circuits and the wirings connected to the plurality of pad driver cells by using wirings made up of another material different from the wirings connected to the plurality of input/output control circuits and different from the wirings connected to the plurality of pad driver cells, a step of connecting specified input/output control circuits continuously located to no pad driver cells, a step of connecting specified pad driver cells selectively or discretely positioned to no input/output control circuits, and a step of connecting selected pad driver cells to the lead frames by using wirings.

In accordance with another aspect of the present invention, a fabrication method of a semiconductor integrated circuit comprising a plurality of input/output control circuits, a plurality of pad driver cells whose number being greater than the number of the plurality of input/output control circuits, each pad driver cell being connectable to each lead frame, and a wiring region formed between the plurality of input/output control circuits and the plurality of pad driver cells, and wirings connected to input and output terminals in each of the plurality of input/output control circuits and wirings connected to input and output terminals in each of the plurality of pad driver cells are formed in the wiring region, the fabrication method comprises a step of selecting each of the plurality of pad driver cells placed at an outer peripheral section in the semiconductor integrated circuit so that each length between each of the plurality of pad driver cells and each of the leads is not more than a predetermined length, a step of connecting each of the pad driver cells to each of the input/output control circuit in the wiring region, and a step of connecting each of the pad driver cells to each of the lead frames by using a lead.

BRIEF DESCRIPTION OF THE DRAWINGS

These and other objects, features, aspects and advantages of the present invention will become more apparent from the following detailed description of the present invention when taken in conjunction with the accompanying drawings, in which:

FIGS. 4A and 4B are diagrams each showing a layout of another configuration of the input/output control circuits, the wiring region and the pad driver cells in the conventional semiconductor integrated circuit;

FIGS. 5A and 5B are diagrams each showing a layout of input/output control circuits, a wiring region and pad driver cells as a part of a semiconductor integrated circuit of the first embodiment according to the present invention;

DESCRIPTION OF THE PREFERRED EMBODIMENTS

Figure 1A:
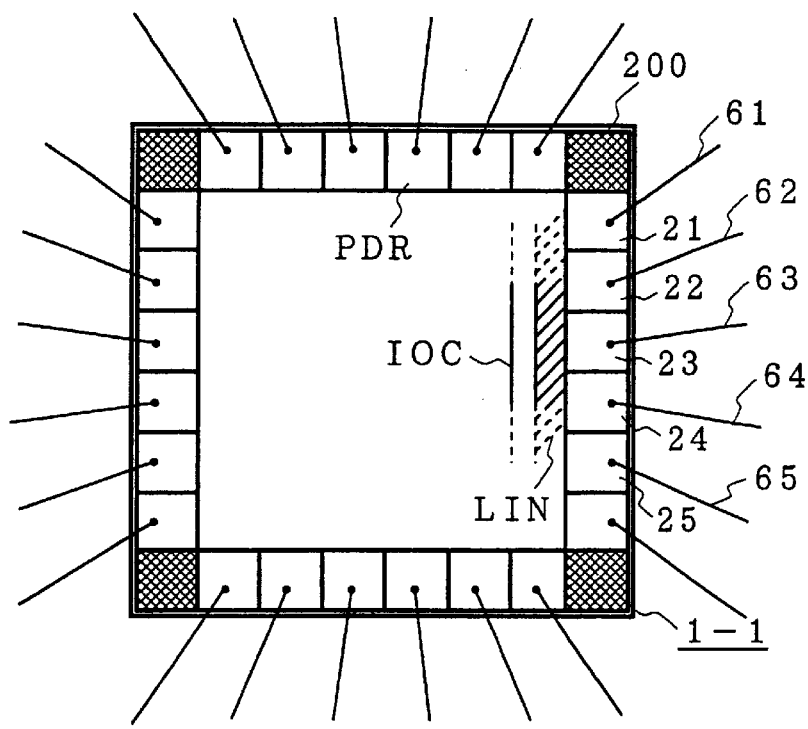
FIGS. 1A and 1B are diagrams each showing a layout of semiconductor elements and leads connected to lead frames in a conventional semiconductor integrated circuit having input/output ports.
Figure 1B:
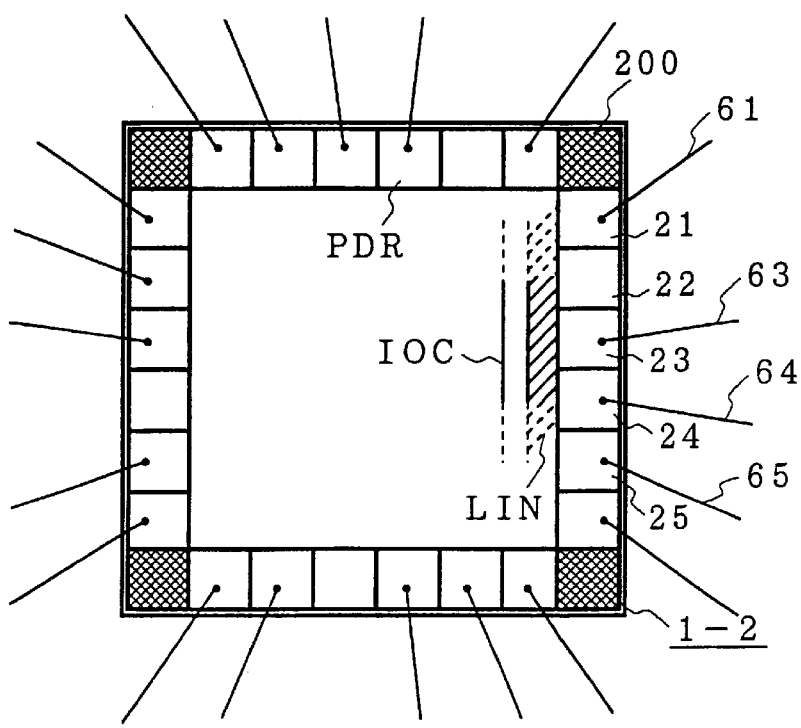

Other features of this invention will become apparent through the following description of preferred embodiments which are given for illustration of the invention and are not intended to be limiting thereof.

Preferred embodiments of a semiconductor integrated circuit and a fabrication method therefor according to the present invention will now be described with reference to the drawings.

First embodiment

FIGS. 5A and 5B are diagrams each showing a layout of input/output control circuits, a wiring region LIN and pad driver cells as a part of a semiconductor integrated circuit of the first embodiment according to the present invention. FIG. 5A shows an allocation of a semiconductor chip having a great number of pins and FIG. 5B shows an allocation of a semiconductor chip having a small number of pins.

In FIGS. 5A and 5B, the reference numbers 21 to 25 designate pad driver cells each including a pad 30 and an output driver, the reference character 10c denotes an input/output control circuit region in which input/output control circuits are formed in a semiconductor chip. The reference character LIN designates a wiring region in which wirings between the input/output control circuits and the pad driver cells 21 to 25, PDR designates a cell region in which the pad driver cells are formed.

In each of the pad driver cells 21 to 25, the reference number 31 designates a P-channel MOS transistor (as a driver) whose source is connected to the power source and whose drain is connected to both input wirings to the pad 30 and the input/output control circuits 11 to 15, 32 denotes a N-channel MOS transistor whose drain is connected to the drain of the P-channel MOS transistor 31 and whose source is connected to the ground.

Both gates of the P-channel MOS transistor 31 and the N-channel MOS transistor 32 are connected to the output control wirings to the input/output control circuits. Both the P-channel MOS transistor 31 and the N-channel MOS transistor 32 form an output driver. In the pad driver cells 21 to 25 shown in FIGS. 5A and 5B, the pad 30 is shown only for the pad driver cell 21 and other pad in the pad driver cells 22 to 25 are omitted from the drawing.

In the input/output control circuits 11 to 15, the reference character IN designates an input terminal of the input wire, and CP and CN denote output terminals of the output control wires. Further, in the pad driver cells 21 to 25, the reference character IN designates an output terminal of the input wirings and CP and CN denote input terminals of the output control wires.

Next, the wiring manner between the input/output control circuits 11 to 15 and the pad driver cells 21 to 25 will now be explained.

In the semiconductor chip, the number of the input/output control circuits 11 to 15 and of other input/output control circuits which are not shown is equal to the number of pins in a semiconductor package having a large number of pins.

In addition, the number of the pad driver cells and of the pad driver cells which are not shown is equal to the number of pins in a semiconductor package having a small number of pins.

As shown in FIGS. 5A and 5B, the pad driver cells 21 to 25 are closely arranged. In the semiconductor chip for a package having a great number of pins shown in FIG. 5A, each of the input/output control circuits 11 to 15 is connected to respective pad driver cells 21 to 25 corresponding to each input/output control circuit.

However, in the semiconductor chip of a package having a small number of pins shown in FIG. 5B, there are pad driver cells 22 and 24 which are placed selectively in position and which are not connected to the input/output control circuits 11 to 15.

The pad driver cells 21, 23 and 25 connected to the input/output control circuits 12, 13 and 14 are connected to corresponding lead frames (not shown) through leads (not shown).

In the semiconductor chip having a small number of pins, for example, the input/output control circuit 11 corresponding to the port A0 is connected to a pad driver cell (not shown). The input/output control circuits 12, 13 and 14 corresponding to the ports A1, A2 and A3 are connected to the pad driver cells 21, 22 and 23, respectively. The pad driver cell (not shown) described above is connected to the terminal corresponding to the port A0 through a lead frame. The other pad driver cells 1, 22 and 23 are connected to terminals corresponding to the ports A1, A2 and A3 through lead frames, respectively.

Thus, the 4 bit ports A0 to A3 are connected to the terminals continuously. In the configuration of the semiconductor integrated circuit including pad driver cells other than the pad driver cells 21 to 25, for example, the ports A0 to A7 and B0 to B7 can be connected continuously to terminals even if a semiconductor package having a small number of pins is used.

In the un-used input/output control circuit 15 shown in FIG. 5B, the output terminals CP and CN are open. That is, the output terminals CP and CN are connected to no output control wires. The input terminal IN is connected to the ground or to the power source. FIG. 5B shown the example in which the input terminal IN of the input/output control circuit 15 is connected to the ground. The output terminals IN in the un-used pad driver cells 22 and 24 are open. That is, the output terminal IN in the pad driver cells 22 and 24 are connected to no input wires. The input terminals CP and CN are connected to the ground or the power source. FIG. 5B shown the example in which the input terminals CP and CN of the input/output control circuit 15 are connected to the ground.

Figure 6A:
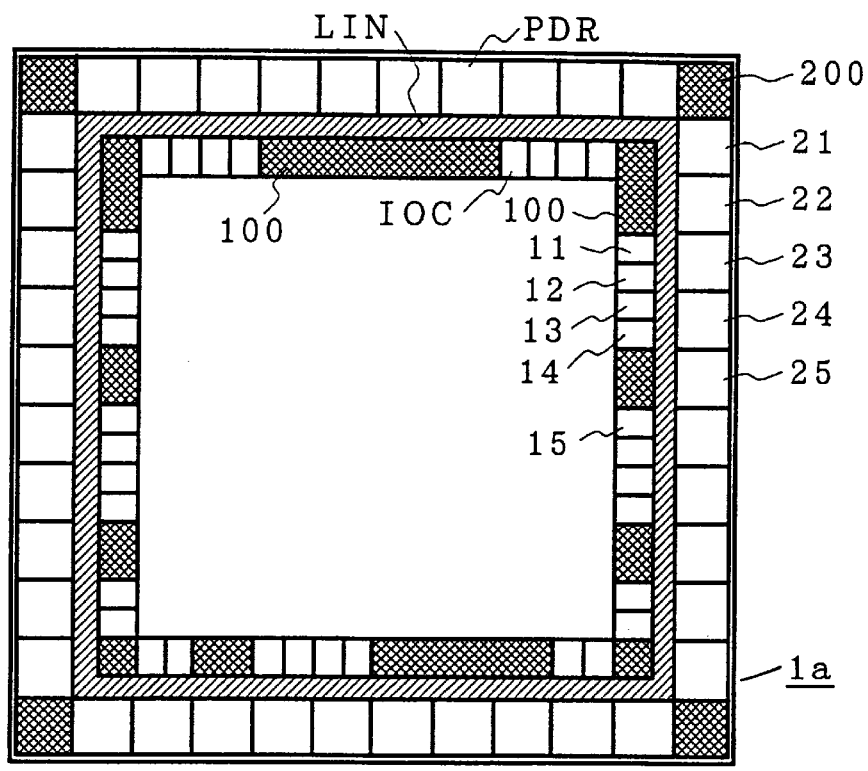
FIGS. 6A and 6B are diagrams each showing a layout of the entire of a semiconductor chip.
Figure 6B:
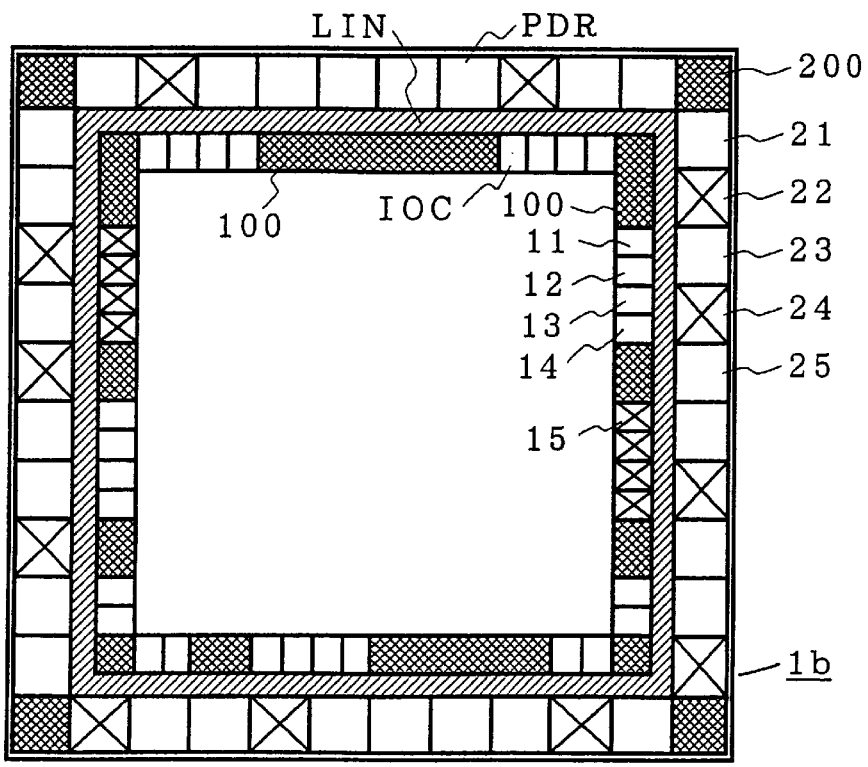

FIGS. 6A and 6B are diagrams each showing a layout of the entire of a semiconductor chip. FIG. 6A shows the layout of a semiconductor chip 1a having a large number of pins and FIG. 6B shows the layout of a semiconductor chip 1b having a small number of pins.

In FIGS. 6A and 6B, the reference number 100 designates a region where no input/output control circuit is placed. The reference number 200 denotes a region where no pad driver cell is placed.

In the region 10c of the input/output control circuit shown in FIG. 6B, the reference character "X" indicates un-used input/output control circuits, for example the input/output control circuit 15. In the region of the pad driver cells shown in FIG. 6B, the reference character "X" indicates un-used pad driver cells, for example the pad driver cells 22 and 24.

Because the wirings in the wiring region LIN can be changeable, as shown in FIG. 6B, un-used input/output control circuits such as the circuit 15 are concentrated into a same region and arranged in this same region in the semiconductor chip 1b having a small number of pins. In other words, the input/output control circuit to be used are grouped in order to arrange them at one region, not at separated regions. That is, the input/output control circuits corresponding to the grouped ports such as the ports A0 to A7 can be selected to be used.

In addition, un-used pad driver cells not to be used can be arranged separately. In this case, there is no offset in the arrangement of the pad driver cells to be used. Because the input/output control circuits to be used can be concentrated into one region to arrange them, ports can be connected to the terminals continuously through pad driver cells and lead frames. Accordingly, it can be performed to arrange port terminals every a 4 bit unit or a 8 bit unit and there are no offset in the arrangement of he pad driver cells to be used, so that it can be avoided to connect a pad driver cell to a lead frame whose position is far away from the pad driver cell with a long lead.

The difference point in configuration between the semiconductor chips 1a and 1b shown in FIGS. 6A and 6B is only the wiring region LIN. This is one of the important features of the present invention.

Next, the actual wiring method in the wiring region LIN will now be explained with reference to layouts shown in FIGS. 7 and 8.

Figure 7:
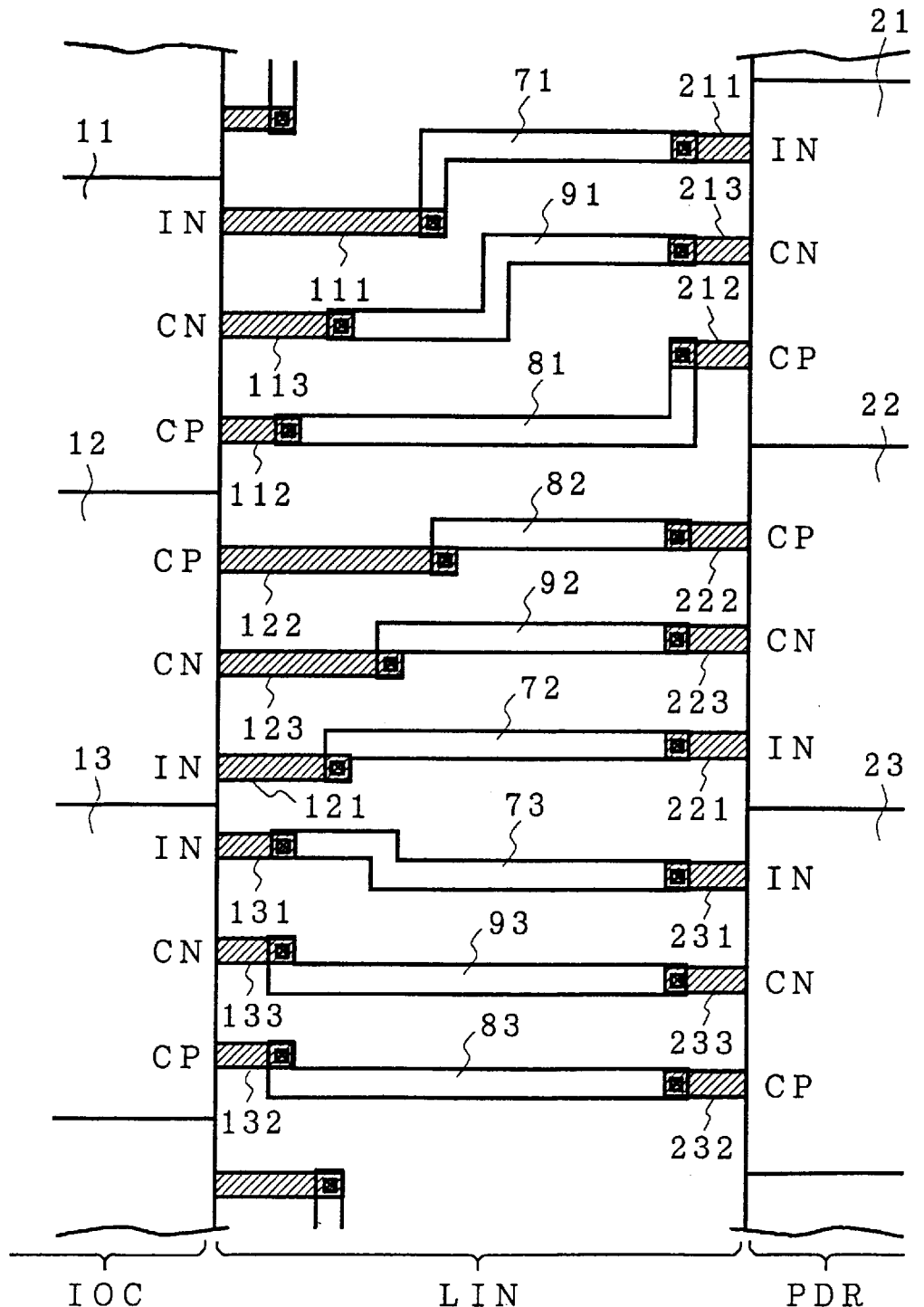
FIG. 7 is a diagram showing a layout of wirings in a semiconductor chip having a large number of pins.

FIG. 7 is a diagram showing a layout of wirings in a semiconductor chip having a large number of pins such as the wirings shown in FIGS. 5A and 6A. FIG. 8 is a diagram showing a layout of wirings in a semiconductor chip having a small number of pins such as the wirings shown in FIGS. 5B and 6B. In both FIGS. 7 and 8, only the input/output control circuits 11 to 13 and the pad driver cells 21 to 23 are shown.

In the wiring region LIN, the input terminal IN and the output terminals CP and CN in each of the input/output control circuits 11 to 13 are connected to poly-silicon wires 111 to 113, and 121 to 123, and 131 to 133. In addition, the output terminals IN and the input terminals CP and CN in the input/output control circuits 21 to 23 are connected to poly-silicon wires 211 to 213, and 221 to 223, and 231 to 233.

In the semiconductor integrated circuit having a large number of pins shown in FIG. 5A, the input/output control circuits 11 to 13 are connected to the pad driver cells 21 to 23, respectively. Accordingly, as shown in FIG. 7, the poly-silicon wires 111 to 113, 121 to 123 and 131 to 133 connected to the input/output control circuits 11 to 13 are connected to the poly-silicon wires 211 to 213, 221 to 223 and 231 to 233 connected to the pad driver cells 21 to 23 by using the aluminum wires 71 to 73, 81 to 83 and 91 to 93.

In the semiconductor integrated circuit having a small number of pins shown in FIG. 5B, the input/output control circuit 12 is connected to the pad driver cell 21, the input/output control circuit 13 is connected to the pad driver cell 23. Accordingly, as shown in FIG. 8, the poly-silicon wires 121, 122 and 123 connected to the input/output control circuit 12 are connected to the poly-silicon wires 211, 212 and 213 connected to the pad driver cell 21 by using the aluminum wires 71, 81 and 91. The poly-silicon wires 131, 132 and 133 connected to the input/output control circuit 13 are connected to the poly-silicon wires 231, 232 and 233 connected to the pad driver cell 23 by using the aluminum wires 73, 83 and 93. The input terminals CP and CN in the un-used pad driver cell 22 not to be used are connected to the ground or the power source through the aluminum wire 103.

As explained above with FIGS. 7 and 8, the connection relationship between the input/output control circuits 11 to 15 and the pad driver cells 21 to 25 can be easily changed based on application by changing the connections among the aluminum wires 71 to 73, 81 to 83 and 91 to 93 in the wiring region LIN.

That is, by using the present invention, it can be easily performed to form the semiconductor integrated circuits having the configuration shown in FIGS. 5A and 6A and FIGS. 5B and 6B by changing the connection among the aluminum wires 71 to 73, 81 to 83 and 91 to 93. In other words, in the semiconductor integrated circuit and the fabrication method therefor according to the present invention, the conventional semiconductor fabrication processes other than aluminum wiring process can be used according to required application and costs. That is, the present invention makes it possible easily to form semiconductor chips corresponding to packages which have different pin numbers only by changing the aluminum wiring process.

In order to easily form aluminum wires in the wiring region LIN, the length of each of the poly-silicon wires 111 to 113, 121 to 123, 131 to 133, 211 to 213, 221 to 223 and 231 to 233 has different, not uniform. For example, each of the poly-silicon wires 111 to 113 is different to each other. The length of each of the poly-silicon wires 131 to 133 is shorter than that of each of the poly-silicon wires 111 to 113 and 121 to 123.

According to the first embodiment of the present invention described above, the input/output control circuits 11 to 15 and the pad driver cells 21 to 25 are formed corresponding to the semiconductor integrated circuit having a large number of pins. In addition, the poly-silicon wires 111 to 113, 121 to 123, 131 to 133, 211 to 213, 221 to 223 and 231 to 233 are connected to the input/output control circuits 11 to 15 and the pad driver cells 21 to 25. Therefore, it can be achieved to obtain various types of packages having different pin number, whose specifications other than the port number are same to each other, only by changing connection among the aluminum wires in the wiring region LIN.

Second embodiment

Figure 9:
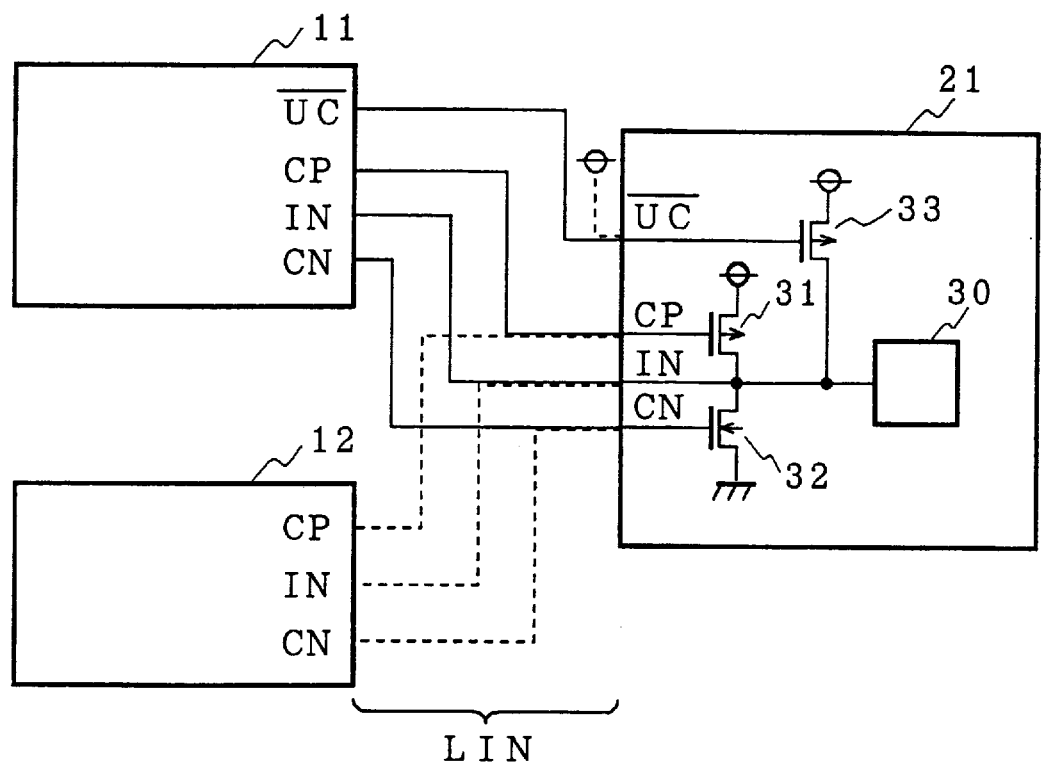
FIG. 9 is a diagram showing a layout of input/output control circuits and pad driver cells in a semiconductor integrated circuit of the second embodiment according to the present invention.

FIG. 9 is a diagram showing a layout of input/output control circuits and pad driver cells in a semiconductor integrated circuit of the second embodiment according to the present invention. FIG. 9 shows only the input/output control circuits 11 and 12 and the pad driver cells 21 for brief explanation.

Although the semiconductor integrated circuit of the first embodiment described above, the function of each port is same, the second embodiment shows the semiconductor integrated circuit in which only a specified port has a pull-up function.

Figure 3:
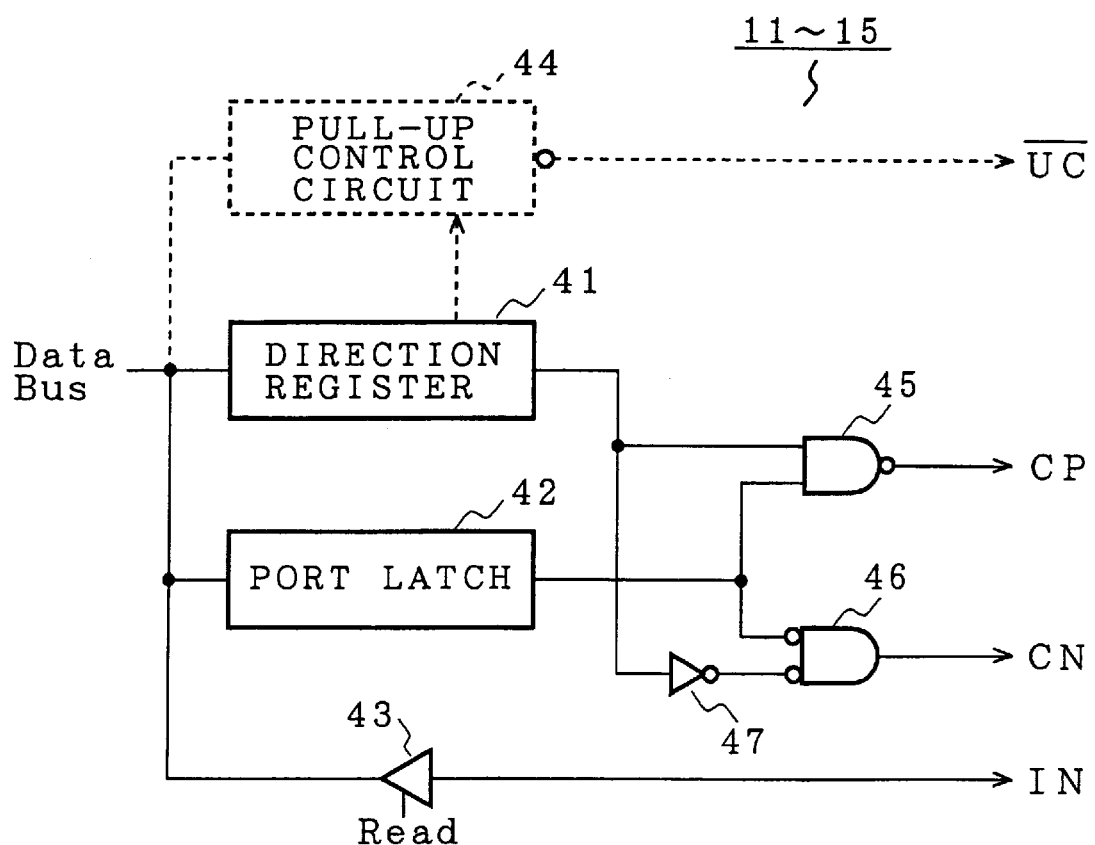
FIG. 3 is a block diagram showing an example of a configuration of the input/output control circuit in the conventional semiconductor integrated circuit.

For example, there is a following specification:

| [Port name] | [Function] |
|---|---|
| " | " |
| " | " |
| Port #11 | Pull-up |
| Port #12 | no Pull-up |
| " | " |
| " | " | where the function "pull-up" means that a port includes the pull-up control circuit 44, as shown in FIG. 3.

In this case, the input/output control circuit 11 used for the port #11 is connected to the pad driver cell 21 in the semiconductor chip having a large number of pins through the aluminum wire and the input/output control circuit 12 used for the port #12 is connected to the pad driver cell 21 in the semiconductor chip having a small number of pins through the aluminum wire.

The input/output control circuit 11 used for the port #11 has the pull-up control circuit 44 shown in FIG. 3. On the other hand, the input/output control circuit 11 used for the port #11 includes no pull-up control circuit 44. In FIG. 9, the reference character "/UC" designates an output terminal or an input terminal connected to a pull-up control circuit.

Figure 2:
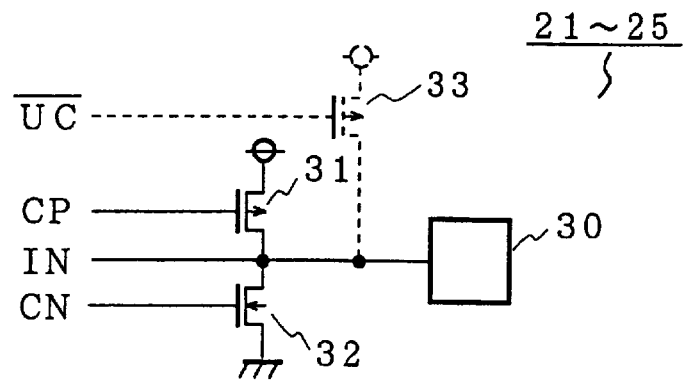
FIG. 2 is a circuit diagram showing a circuit configuration of each of pad driver cells.
Figure 8:
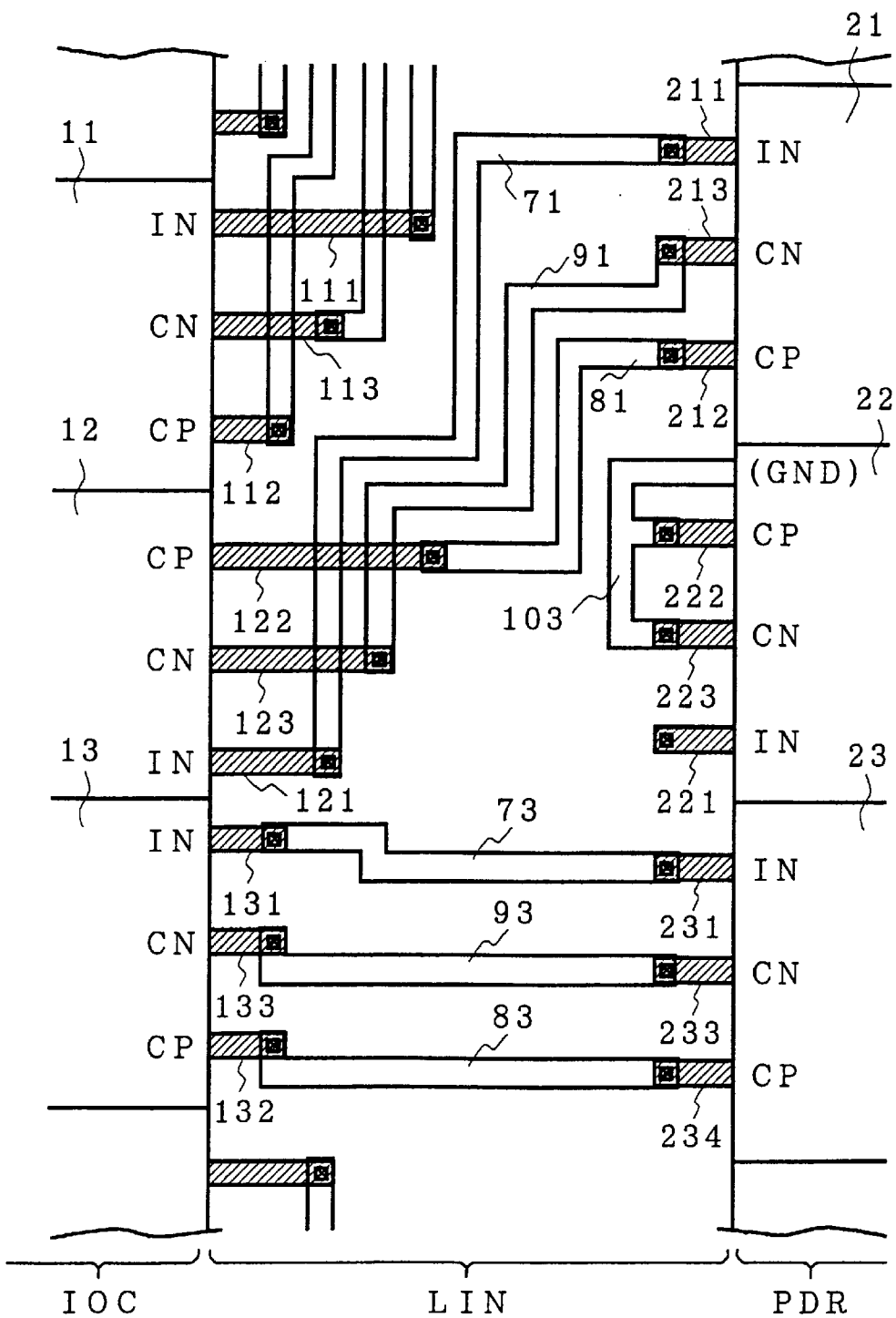
FIG. 8 is a diagram showing a layout of wirings in a semiconductor chip having a small number of pins.

In this case described above, the pad driver cell 21 includes the P-channel MOS transistor (as a driver) 33 shown in FIG. 2 and the poly-silicon wire connected to the input terminal UC in the input/output control circuit 11 is required in addition to the poly-silicon wires 111, 112 and 113 shown in FIGS. 7 and 8. Further, the poly-silicon wire connected to the input terminal /UC in the pad driver cell 21 is also required in addition to the poly-silicon wires 211, 212 and 213 shown in FIGS. 7 and 8.

In the semiconductor chip having a large number of pins shown in FIG. 7, the poly-silicon wires 111, 112 and 113 are connected to the poly-silicon wires 211, 212 and 213 through the aluminum wires 71, 81 and 91. In addition, the poly-silicon wire connected to the output terminal UC of the input/output control circuit 11 is connected to the poly-silicon wire connected to the input terminal UC of the pad driver cell 21 through the aluminum wire.

In the semiconductor chip having a small number of pins shown in FIG. 8, the poly-silicon wires 121, 122 and 123 are connected to the poly-silicon wires 211, 212 and 213 through the aluminum wires 71, 81 and 91, respectively.

In FIG. 9, the connection manner used for a semiconductor chip having a small number of pins is shown by using the dotted lines. In this case, the poly-silicon wire connected to the input terminal in the pad driver cell 21 is connected to the power source through the aluminum wire so that the P-channel MOS transistor enters an off state (inactive state), namely it enters a normally off state.

As described above, in the second embodiment, the pad driver cell has the P-channel MOS transistor 33 for the pull up function. Accordingly, even if the input/output control circuit 11 corresponding to a port having the pull-up function is assigned or even if the input/output control circuit 12 corresponding to a port having no pull-up function is allocated, it can be achieved to form semiconductor chips having different pins, different shapes and the like only by changing wiring connection in the wiring region LIN.

Although only the port having the pull-up function is described in the explanation of the second embodiment described above, the concept of the second embodiment of the present invention can be applied to the case that one port is a dedicated input port used for input only or dedicated output port for output only. For example, the pad driver cell 21 is connected to an input/output port used for both input and output when a semiconductor chip has a large number of pins and the pad driver cell 21 is connected to a dedicated input port used for input only when a semiconductor chip has a small number of pins. In those cases, the input terminals CP and CN in the pad driver cell 21 are connected to the ground when a semiconductor chip has a large number of pins. Further, the output terminal In of the pad driver cell 21 is open when the pad driver cell 21 is connected to the dedicated output port and a semiconductor chip has a large number of pins.

Third embodiment

Figure 10:
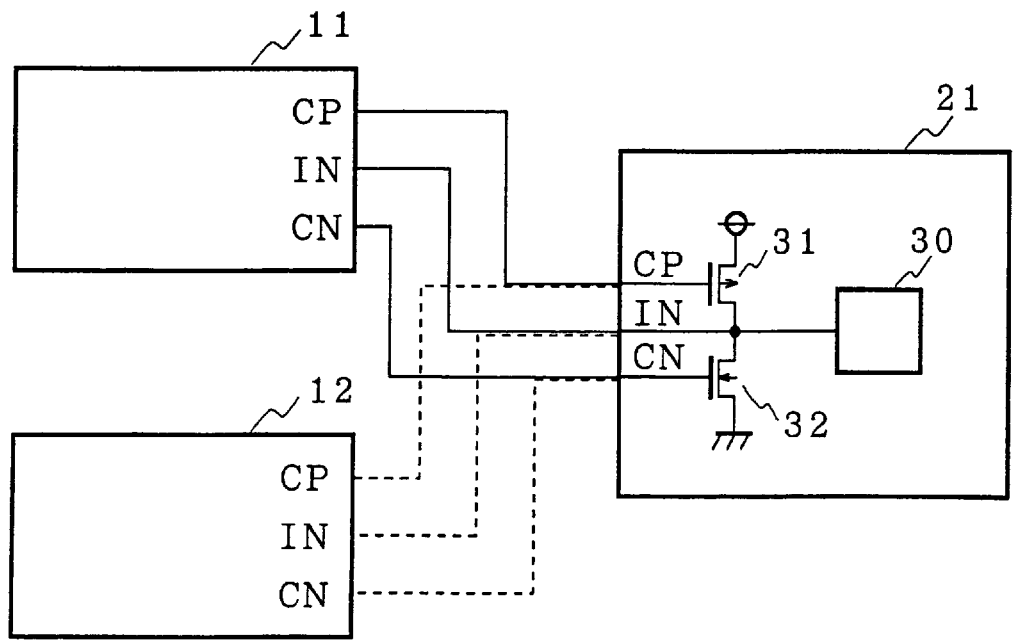
FIG. 10 is a diagram showing a layout of input/output control circuits and pad driver cells in a semiconductor integrated circuit of the third embodiment according to the present invention.

FIG. 10 is a diagram showing a layout of input/output control circuits and pad driver cells in the semiconductor integrated circuit of the third embodiment according to the present invention.

FIG. 10 shows only the input/output control circuits 11 and 12 and the pad driver cells 21 for brief explanation.

Although the semiconductor integrated circuit of the first embodiment described above, the function of each port is same, the third embodiment shows the semiconductor integrated circuit in which the driving function of each port is different to each other.

For example, there is a following specification:

| [Port name] | [Function (minimum value)] | |
| --- | --- | --- |
| " | (P-ch. side) | (N-ch. side) |
| " | | |
| Port #11 | 100 | 150 |
| Port #12 | 120 | 100 |
| " | | |
| " | | |

The input/output control circuit 11 for the port #11 is connected to the pad driver cell 21 through an aluminum wire in the semiconductor chip having a large number of pins, and the input/output control circuit 12 for the port #12 is connected to the pad driver cell 21 through an aluminum wire in the semiconductor chip having a small number of pins. In this case, the driving abilities of the P-channel MOS transistor 31 and the N-channel MOS transistor 32 in the pad driver cell 21 are set to the larger driving ability in them. Specifically, the pad driver cell 21 is formed so that the driving ability of the P-channel MOS transistor is set to 120 and the N-channel MOS transistor 32 is set to 150.

In the semiconductor chip having a large number of pins shown in FIG. 7, the poly-silicon wires 111, 112 and 113 may be connected to the poly-silicon wires 211, 212 and 213 through the aluminum wires 71, 81 and 91. On the other hand, in the semiconductor chip having a small number of pins shown in FIG. 8, the poly-silicon wires 121, 122 and 123 may be connected to the poly-silicon wires 211, 212 and 213 through the aluminum wires 71, 81 and 91.

In general, since the driving ability is determined by using the minimum value, for example, when the driving abilities of the P-channel MOS transistor side and the N-channel MOS transistor side in the port #11 are 100 and 150, respectively, in the specification, it can be acceptable, namely there is no problem, that the driving abilities of the P-channel MOS transistor side and the N-channel MOS transistor side are 120 and 150, respectively.

As described above in detail, in the third embodiment, the driving abilities of the P-channel MOS transistor 31 and the N-channel MOS transistor 32 in the pad driver cell 21 are designed based on the required maximum values. Accordingly, even if there are ports whose driving abilities to be required are different, it can be achieved to form semiconductor chips having different pin configurations only by changing wiring connection in the wiring region LIN.

Fourth embodiment

Figure 11:
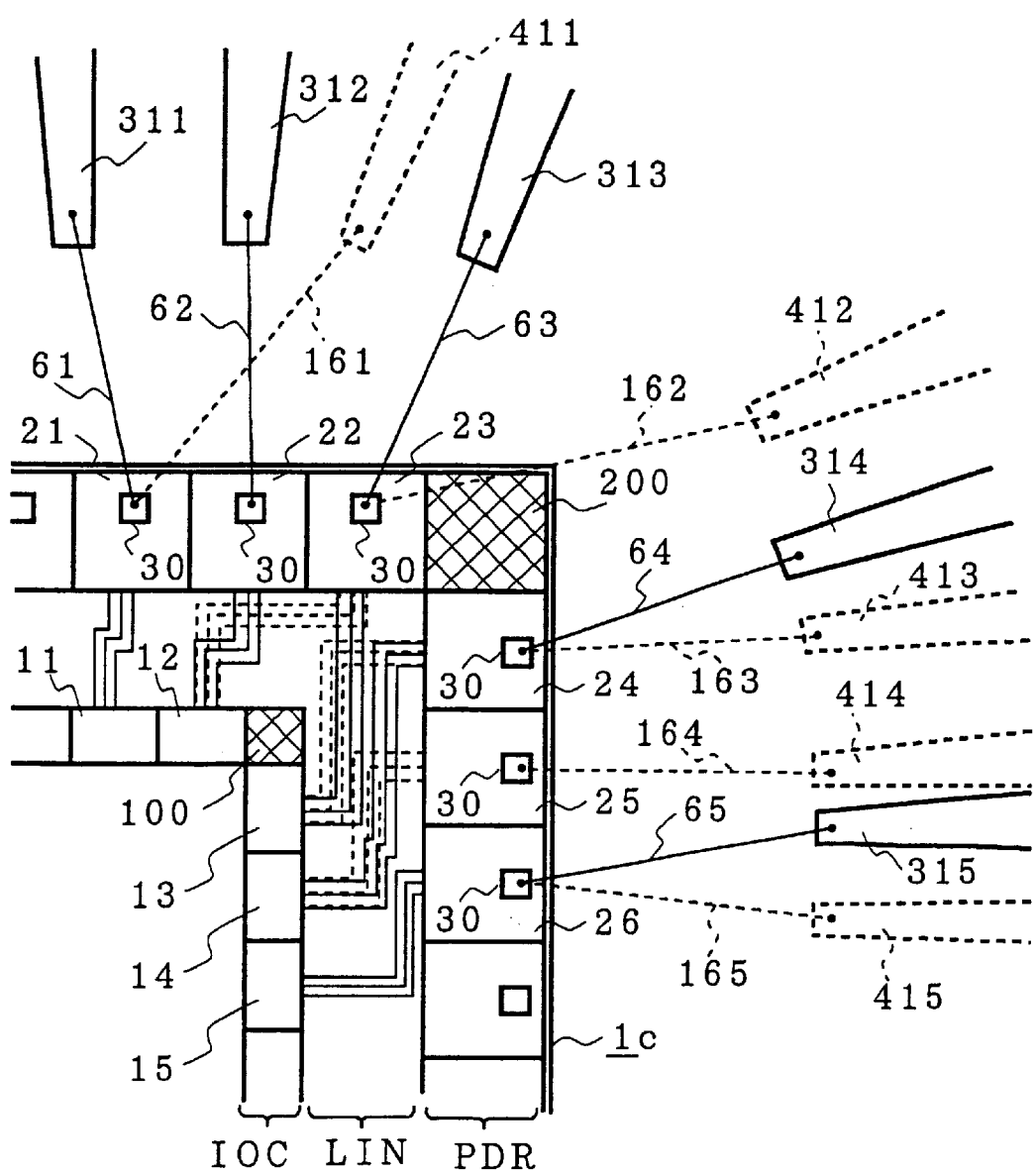
FIG. 11 is a diagram showing a layout of lead frames, leads and a part of a chip as a semiconductor integrated circuit of the fourth embodiment according to the present invention.

FIG. 11 is a diagram showing a layout of lead frames, leads and a part of a chip as a semiconductor integrated circuit of the fourth embodiment according to the present invention. In FIG. 11, the reference numbers 311 to 315 designate the tips of lead frames which are connected to the pads 30 in the pad driver cells 21 to 26 through leads 61 to 65, respectively. The reference numbers 411 to 415 denote tips of lead frames which are connected to the pads 30 in the pad driver cells 21 to 25 through leads 161 to 165.

In FIG. 11, the tips 311 to 315 of the lead frames indicated by the solid lines are formed in a semiconductor integrated circuit in a semiconductor package (the first package), and the tips 411 to 415 of the lead frames indicated by the dotted lines are formed in another semiconductor integrated circuit in a semiconductor package (the second package).

In the fourth embodiment, the number of the pad driver cells including un-shown pad driver cells (omitted from FIG. 11) in the cell region PDR is greater than that of the input/output control circuits including un-shown input/output control circuits (also omitted from FIG. 11). The number of input/output control circuits is equal to that of the pins in the first package which is also equal to the number of the pins in the second package.

Even if the number of the pins in the first package is equal to the number of the pins in the second package, as shown in FIG. 11, there is a case that positions of the tips of the lead frames 311 to 315 and 411 to 415 are different. For example, there is the case that the shape of one package is a square and the shape of the other package is a rectangular. In this case, when the same semiconductor chip 1c in configuration is used for both packages, wirings between the pad 30 and the tips of the lead frames 311 to 315 and 411 to 415 become difficult in one package. Specifically, at a corner section in the semiconductor chip 1c, an offset between the arrangement of the tips 311 to 315 of the lead frames in one package and that of the tips 411 to 415 of the lead frames in the other package becomes large. In this case, for example, as shown by the dotted lines in FIG. 11, because when the pad 30 in the pad driver cell 22 is connected to the tip 412 of the lead frame through a wiring or when the pad 30 in the pad driver cell 23 is connected to the tip 413 of the lead frame through a wiring, the length of each of the wirings becomes long. This causes a failure of the semiconductor integrated circuit.

In order to avoid this, based on the fourth embodiment, semiconductor integrated circuits are formed based on applications so that the combination of the pad driver cells 21, 23 to 26 used for the second package and the combination of the pad driver cells 21 to 24 and 26 used for the first package become different.

As shown in FIG. 11, each of the pad driver cells 21 to 26 is selected so that the length of each of the leads 61 to 65 and 161 to 165 formed between each of the tips 311 to 315, 411 to 415 of the lead frames and each of the pads 30 does not long, namely this length is not more than a predetermined length.

Because the number of the pad driver cells is greater than that of the input/output control circuits, namely because the number of the pad driver cells is larger than that of the pad driver cells, it can be easily performed to change the pad driver cells 21 to 26 to be used.

According to the change of the pad driver cells 21 to 26 to be used, the wirings in the wiring region LIN in the semiconductor chip 1c to be sealed in the first package and the wirings in the wiring region LIN in the semiconductor chip 1c to be sealed in the second package are changed. The poly-silicon wire shown in FIG. 7 is connected to each of the input/output control circuits 11 to 15. In addition, the poly-silicon wire shown in FIG. 7 is connected to each of the pad driver cells 21 to 26. Then, in the semiconductor chip 1c to be sealed in the first package, each of the input/output control circuit 11 to 15 is connected to each of the pad driver cells 21 to 24 and 26 through the aluminum wires. In addition, in the semiconductor chip 1c to be sealed in the second package, each of the input/output control circuit 11 to 15 is connected to each of the pad driver cells 21, 23 to 26 through the aluminum wires.

As described above in detail, in the fourth embodiment, the number of pins in a package is larger than that of the input/output control circuit 11 to 15 formed in the semiconductor chip 1c. Thereby, when the position of lead frames is changed, it can be performed to easily change wirings between the pad driver cells 21 to 16 and the lead frames in a changeable position range. Specifically, this feature can be greatly applicable to a corner section in a semiconductor chip in which the positions of lead frames in packages having different shapes are greater different to each other.

Although the explanation for the two packages having the same pin number and different shapes has been explained described above in the fourth embodiment, the present invention is not limited by this example, for example, the present invention can be applicable to a case of packages having different pin numbers.

Furthermore, the concept and method of the second and third embodiment described above can be applied to the case of the fourth embodiment. In this case, the effect obtained by the second and third embodiments can also be obtained.

As described above in detail, according to the present invention, a semiconductor integrated circuit has the configuration that the number of the plurality of pad driver cells is the same or more as the number of the plurality of input/output control circuits, third wirings made up of a material or materials which connect a first wirings connected to the plurality of input/output control circuit to a second wirings connected to the plurality of pad driver cells and the material of the third wirings are different from a material or materials forming the first wirings and the second wirings, there are no wirings between specified input/output control circuit which being located continuously in position in the plurality of input/output control circuits and the plurality of pad driver cells, and there are no wirings between specified pad driver cells, which being located in separately, in the plurality of pad driver cells and the plurality of input/output control circuits. Thereby, the present invention can be applicable to fit various types of packages in shape and the like. Specifically, it can be performed to fabricate a semiconductor integrated element used for packages having a small number of pins wit a low fabrication cost.

In addition, according to the present invention, the semiconductor integrated circuit having the configuration that wirings connected to the input terminals in the wirings connected to the specified input/output control circuits continuously positioned and connected to the specified pad driver cells continuously located are connected to a power source or to a ground and the wirings connected to the output terminals are open. Thereby, the present invention has the effect that un-used input/output control circuit and un-used pad driver cells can be changed in arrangement only by changing wirings in the wiring region LIN.

Furthermore, according to the present invention, the semiconductor integrated circuit having the configuration that each of the plurality of pad driver cells has a driver whose driving ability is equal to or more than the maximum driving ability in a driving ability required for each port which is connected to each of the corresponding input/output control circuit through the wiring region. Thereby, the present invention has the effect that ports having different driving abilities can be formed without changing the position of the pad driver cells.

Moreover, according to the present invention, the semiconductor integrated circuit having the configuration that the pad driver cell has a function corresponding to a function of the port corresponding to the input/output control circuit connected to this pad driver cell through the wiring region. Thereby, the present invention has the effect that ports having different driving abilities can be formed without changing the position of the pad driver cells.

In addition, according to the present invention, the semiconductor integrated circuit having the configuration that the total number of the plurality of pad driver cells is greater than that of the plurality of input/output control circuits. Thereby, the present invention has the effect that many types of semiconductor integrated circuits corresponding to various types of packages having same pin numbers and different shapes can be formed only by changing wirings.

Furthermore, according to the present invention, the fabrication method for the semiconductor integrated circuit having a step of selecting each of the plurality of pad driver cells placed at an outer peripheral section in the semiconductor integrated circuit so that each length between each of the plurality of pad driver cells and each of the leads being not more than a predetermined length, a step of connecting each of the pad driver cells to each of the input/output control circuit in the wiring region, and a step of connecting each of the pad driver cells to each of the lead frames by using a lead, or a step of connecting in the wiring region between the wirings connected to the plurality of input/output control circuits and the wirings connected to the plurality of pad driver cells by using wirings made up of another material different from the wirings connected to the plurality of input/output control circuits and different from the wirings connected to the plurality of pad driver cells. Thereby, the present invention has the effect that many types of semiconductor integrated circuits corresponding to various types of packages having same pin numbers and different shapes can be formed only by changing wirings.

While the above provides a full and complete disclosure of the preferred embodiments of the present invention, various modifications, alternate constructions and equivalents may be employed without departing from the true spirit and scope of the invention. Therefore the above description and illustration should not be construed as limiting the scope of the invention, which is defined by the appended claims.

What is claimed is:

1. A fabrication method of a semiconductor integrated circuit comprising a plurality of input/output control circuits, a plurality of pad driver cells, wherein each pad driver cell is connectable to respective lead frames, and a wiring region formed between the plurality of input/output control circuits and the plurality of pad driver cells, the fabrication method comprising:

a step of forming the plurality of pad driver cells whose number is equal to or more than the number of input/output control circuits;

a step of forming wirings connected to input and output terminals in each of the plurality of input/output control circuits and wirings connected to input and output terminals in each of the plurality of pad driver cells in the wiring region, the wirings having an inherent length, respectively;

a step of connecting, in the wiring region, the wirings connected to the plurality of input/output control circuits and the wirings connected to the plurality of pad driver cells by using wirings made up of another material different from the wirings connected to the plurality of input/output control circuits and different from the wirings connected to the plurality of pad driver cells;

a step of not connecting specified input/output control circuits to pad driver cells;

a step of not connecting specified pad driver cells to input/output control circuits; and a step of connecting selected pad driver cells to the lead frames by using wirings.

2. A fabrication method of a semiconductor integrated circuit comprising a plurality of input/output control circuits, a plurality of pad driver cells whose number is greater than the number of the plurality of input/output control circuits, each pad driver cell being connectable to respective lead frames, and a wiring region formed between the plurality of input/output control circuits and the plurality of pad driver cells, and wirings connected to input and output terminals in each of the plurality of input/output control circuits and wirings connected to input and output terminals in each of the plurality of pad driver cells are formed in the wiring region, the fabrication method comprises:

a step of selecting pad driver cells among the plurality of pad driver cells placed at a corner section in the semiconductor integrated circuit for connection to respective leads so that each length between each of the plurality of pad driver cells and respective leads is not more than a predetermined length;

a step of connecting each of the pad driver cells to respective input/output control circuits in the wiring region; and a step of connecting each of the pad driver cells to respective lead frames by using a lead.

3. A fabrication method of a semiconductor integrated circuit comprising a plurality of input/output control circuits, a plurality of pad driver cells, wherein each pad driver cell is connectable to respective lead frames, and a wiring region formed between the plurality of input/output control circuits and the plurality of pad driver cells, the fabrication method comprising:

a step of forming the plurality of pad driver cells whose number is equal to or more than the number of input/output control circuits;

a step of forming wirings connected to input and output terminals in each of the plurality of input/output control circuits and wirings connected to input and output terminals in each of the plurality of pad driver cells in the wiring region, the wirings having an inherent length, respectively; and a step of connecting, in the wiring region, the wirings connected to the plurality of input/output control circuits and the wirings connected to the plurality of pad driver cells by using wirings made up of another material different from the wirings connected to the plurality of input/output control circuits and different from the wirings connected to the plurality of pad driver cells.

* * * * *